US012751283B2

(12) United States Patent
Cheng et al.

(10) Patent No.: US 12,751,283 B2
(45) Date of Patent: Sep. 29, 2026

(54) METAL-INSULATOR-METAL STRUCTURES AND METHODS OF FORMING THE SAME

(71) Applicant: Taiwan Semiconductor Manufacturing Company, Ltd., Hsinchu (TW)

(72) Inventors: Chung-Liang Cheng, Changhua City (TW); Sheng-Chau Chen, Tainan City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 470 days.

(21) Appl. No.: 18/335,838

(22) Filed: Jun. 15, 2023

(65) Prior Publication Data

US 2024/0421066 A1 Dec. 19, 2024

(51) Int. Cl.

| | |
|---|---|
| ***H10W 20/40*** | (2026.01) |
| ***H10D 1/00*** | (2025.01) |
| ***H10D 1/68*** | (2025.01) |
| ***H10W 20/00*** | (2026.01) |
| ***H10W 20/41*** | (2026.01) |

(52) U.S. Cl.

CPC .......... *H10W 20/496* (2026.01); *H10D 1/042* (2025.01); *H10D 1/716* (2025.01); *H10W 20/033* (2026.01); *H10W 20/048* (2026.01); *H10W 20/425* (2026.01)

(58) Field of Classification Search

CPC ........... H01L 23/5223; H01L 23/53238; H01L 23/53266; H01L 21/76843; H01L 21/76856; H10D 1/716; H10D 1/042; H10W 20/496; H10W 20/425; H10W 20/033; H10W 20/048

See application file for complete search history.

(56) References Cited

U.S. PATENT DOCUMENTS

2012/0211865 A1* 8/2012 Tian ..................... H10D 84/212 257/532
2014/0145302 A1* 5/2014 Hong ................ H01L 21/76877 257/532
2020/0295151 A1* 9/2020 Xie .................... H10D 30/6219

OTHER PUBLICATIONS

Pending U.S. Appl. No. 18/308,928, entitled "Deep Trench Capacitor Structure and Methods of Formation", filed Apr. 28, 2023.

* cited by examiner

*Primary Examiner* — Timor Karimy
(74) *Attorney, Agent, or Firm* — Harrity & Harrity, LLP

(57) ABSTRACT

Forming a barrier layer and removing the barrier layer from an upper portion of a recess in which a metal-insulator-metal (MIM) structure will be formed allows for forming the MIM structure with fewer voids, which improves capacitance of the MIM structure. For example, a bottom layer anti-reflective coating may be deposited and etched back in order to allow for removal of the barrier layer from the upper portion of the recess but not from a bottom portion of the recess. Additionally, the barrier layer may be formed using physical vapor deposition, which reduces carbon impurities in the barrier layer as compared with using atomic layer deposition, which improves resistance for the MIM structure.

20 Claims, 15 Drawing Sheets

METAL-INSULATOR-METAL STRUCTURES AND METHODS OF FORMING THE SAME

BACKGROUND

A capacitor structure, such as a deep trench capacitor (DTC) structure in an image sensor device, may include a metal-insulator-metal (MIM) structure in which an insulator layer is sandwiched between two conductive electrode layers.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
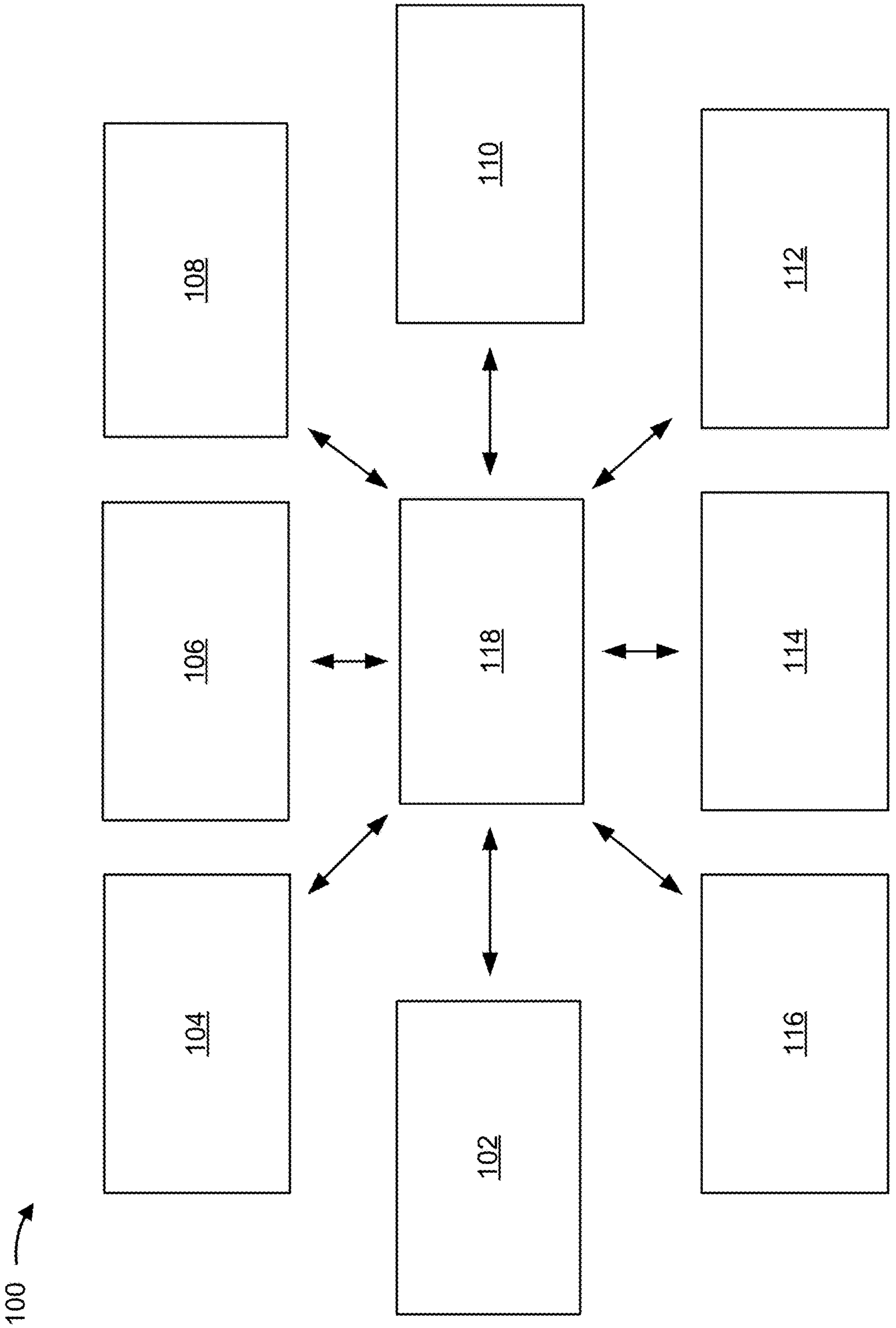
FIG. 1 is a diagram of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some cases, a capacitor structure, such as a deep trench capacitor (DTC) structure in an image sensor device, may include a metal-insulator-metal (MIM) structure in which an insulator layer is sandwiched between two conductive electrode layers. In a semiconductor device, such as an image sensor device, the MIM structure may be included in a back end of line (BEOL) region of the semiconductor device. The capacitor structure may include a MIM structure having an insulator layer between opposing conductive electrode layers. In some cases, the DTC structure may extend through a plurality of dielectric layers in the BEOL region.

Copper is often used for BEOL metallization layers and vias (also referred to as M1. M2, or M3 interconnects or metallization layers) or for middle end of line (MEOL) contact plugs (also referred to as M0 interconnects or metallization layers) due to low contact resistance and sheet resistance relative to other conductive materials, such as aluminum (Al). However, copper also has a high diffusion (or electromigration) rate, which can cause copper ions to diffuse into surrounding dielectric material. This diffusion results in an increase in resistivity for BEOL metallization layers and vias (or for MEOL contact plugs). Increased resistivity can decrease electrical performance of an electronic device.

Additionally, diffusion may result in copper ions migrating into other layers, such as the MIM structure, which can cause semiconductor device failures and reduced manufacturing yield. In order to prevent diffusion, a barrier layer (e.g., formed of a nitride material) may be formed between the MIM structure and an adjacent metallization layer. However, nitride has increased resistance and surface roughness, so a buffer layer (e.g., formed of metal) may be formed between the MIM structure and the barrier layer. However, voids are likely to form in the MIM structure if the barrier and buffer layers are too thick at a top surface of a recess in which the MIM structure is formed. In order to reduce thickness, atomic layer deposition (ALD) may be used for the barrier layer instead of physical vapor deposition (PVD). However, using ALD results in carbon formed in the barrier layer, which increases resistance.

Some implementations described herein provide techniques and apparatuses for removing a barrier layer from an upper portion of a recess in which an MIM structure will be formed after forming the barrier layer using PVD. For example, a bottom layer anti-reflective coating (BARC) may be deposited and etched back in order to allow for removal of the barrier layer from the upper portion of the recess but not from a bottom portion of the recess. As a result, the barrier layer is reduced such that the MIM structure may be formed in the recess with fewer chances of voids, which improves capacitance of the MIM structure. Additionally, the barrier layer is formed using PVD to reduce carbon impurities, as compared with ALD, which improves resistance for the MIM structure.

FIG. 1 is a diagram of an example environment 100 in which systems and/or methods described herein may be implemented. As shown in FIG. 1, environment 100 may include a plurality of semiconductor processing tools 102-116 and a wafer/die transport tool 118. The plurality of semiconductor processing tools 102-116 may include a deposition tool 102, an exposure tool 104, a developer tool 106, an etch tool 108, a planarization tool 110, a plating tool 112, a photoresist removal tool 114, an annealing tool 116, and/or another semiconductor processing tool. The tools included in the example environment 100 may be included in a semiconductor clean room, a semiconductor foundry, a semiconductor processing and/or manufacturing facility, or another location.

The deposition tool 102 is a semiconductor processing tool that includes a semiconductor processing chamber and one or more devices capable of depositing various types of materials onto a substrate. In some implementations, the deposition tool 102 includes a spin coating tool that is capable of depositing a photoresist layer on a substrate such as a wafer. In some implementations, the deposition tool 102 includes a chemical vapor deposition (CVD) tool such as a plasma-enhanced CVD (PECVD) tool, a low pressure CVD (LPCVD) tool, a high-density plasma CVD (HDP-CVD) tool, a sub-atmospheric CVD (SACVD) tool, an atomic layer deposition (ALD) tool, a plasma-enhanced atomic layer deposition (PEALD) tool, an epitaxy tool, or another type of CVD tool. In some implementations, the deposition tool 102 includes a physical vapor deposition (PVD) tool, such as a sputtering tool or another type of PVD tool. In some implementations, the example environment 100 includes a plurality of types of deposition tools 102.

The exposure tool 104 is a semiconductor processing tool that is capable of exposing a photoresist layer to a radiation source, such as an ultraviolet light (UV) source (e.g., a deep UV light source, an extreme UV light (EUV) source, and/or the like), an x-ray source, an electron beam (e-beam) source, and/or the like. The exposure tool 104 may expose a photoresist layer to the radiation source to transfer a pattern from a photomask to the photoresist layer. The pattern may include one or more semiconductor device layer patterns for forming one or more semiconductor devices, may include a pattern for forming one or more structures of a semiconductor device, may include a pattern for etching various portions of a semiconductor device, and/or the like. In some implementations, the exposure tool 104 includes a scanner, a stepper, or a similar type of exposure tool.

The developer tool 106 is a semiconductor processing tool that is capable of developing a photoresist layer that has been exposed to a radiation source to develop a pattern transferred to the photoresist layer from the exposure tool 104. In some implementations, the developer tool 106 develops a pattern by removing unexposed portions of a photoresist layer. In some implementations, the developer tool 106 develops a pattern by removing exposed portions of a photoresist layer. In some implementations, the developer tool 106 develops a pattern by dissolving exposed or unexposed portions of a photoresist layer through the use of a chemical developer.

The etch tool 108 is a semiconductor processing tool that is capable of etching various types of materials of a substrate, wafer, or semiconductor device. For example, the etch tool 108 may include a wet etch tool, a dry etch tool, and/or the like. In some implementations, the etch tool 108 includes a chamber that is filled with an etchant, and the substrate is placed in the chamber for a particular time period to remove particular amounts of one or more portions of the substrate. In some implementations, the etch tool 108 may etch one or more portions of the substrate using a plasma etch or a plasma-assisted etch, which may involve using an ionized gas to isotropically or directionally etch the one or more portions.

The planarization tool 110 is a semiconductor processing tool that is capable of polishing or planarizing various layers of a wafer or semiconductor device. For example, a planarization tool 110 may include a chemical mechanical planarization (CMP) tool and/or another type of planarization tool that polishes or planarizes a layer or surface of deposited or plated material. The planarization tool 110 may polish or planarize a surface of a semiconductor device with a combination of chemical and mechanical forces (e.g., chemical etching and free abrasive polishing). The planarization tool 110 may utilize an abrasive and corrosive chemical slurry in conjunction with a polishing pad and retaining ring (e.g., typically of a greater diameter than the semiconductor device). The polishing pad and the semiconductor device may be pressed together by a dynamic polishing head and held in place by the retaining ring. The dynamic polishing head may rotate with different axes of rotation to remove material and even out any irregular topography of the semiconductor device, making the semiconductor device flat or planar.

The plating tool 112 is a semiconductor processing tool that is capable of plating a substrate (e.g., a wafer, a semiconductor device, and/or the like) or a portion thereof with one or more metals. For example, the plating tool 112 may include a copper electroplating device, an aluminum electroplating device, a nickel electroplating device, a tin electroplating device, a compound material or alloy (e.g., tin-silver, tin-lead, and/or the like) electroplating device, and/or an electroplating device for one or more other types of conductive materials, metals, and/or similar types of materials.

The photoresist removal tool 114 is a semiconductor processing tool that is capable of removing remaining portions of a photoresist layer from a substrate after the etch tool 108 removes portions of the substrate. For example, the photoresist removal tool 114 may use a chemical stripper and/or another technique to remove a photoresist layer from a substrate.

The annealing tool 116 is a semiconductor processing tool that includes a semiconductor processing chamber and one or more devices capable of heating a semiconductor substrate or semiconductor device. For example, the annealing tool 116 may include a rapid thermal annealing (RTA) tool or another type of annealing tool that is capable of heating a semiconductor substrate to cause a reaction between two or more materials or gasses, to cause a material to decompose. As another example, the annealing tool 116 may be configured to heat (e.g., raise or elevate the temperature of) a structure or a layer (or portions thereof) to re-flow the structure or the layer, or to crystallize the structure or the layer, to remove defects such as voids or seams. As another example, the annealing tool 116 may be configured to heat (e.g., raise or elevate the temperature of) a layer (or portions thereof) to enable bonding of two or more semiconductor devices.

The wafer/die transport tool 118 may be included in a cluster tool or another type of tool that includes a plurality of processing chambers, and may be configured to transport substrates and/or semiconductor devices between the plurality of processing chambers, to transport substrates and/or semiconductor devices between a processing chamber and a buffer area, to transport substrates and/or semiconductor devices between a processing chamber and an interface tool such as an equipment front end module (EFEM), and/or to transport substrates and/or semiconductor devices between a processing chamber and a transport carrier (e.g., a front opening unified pod (FOUP)), among other examples. In some implementations, a wafer/die transport tool 118 may be included in a multi-chamber (or cluster) deposition tool 102, which may include a pre-clean processing chamber (e.g., for cleaning or removing oxides, oxidation, and/or other types of contamination or byproducts from a substrate and/or semiconductor device) and a plurality of types of deposition processing chambers (e.g., processing chambers for depositing different types of materials, processing chambers for performing different types of deposition operations).

In some implementations, one or more of the semiconductor processing tools 102-116 and/or the wafer/die transport tool 118 may perform one or more semiconductor processing operations described herein. For example, one or more of the semiconductor processing tools 102-116 and/or the wafer/die transport tool 118 may form a recess in a dielectric layer to expose a surface of a copper metallization layer; form, using PVD, a first barrier layer on sidewalls of the recess and the exposed surface of the copper metallization layer; form a carbon-based layer in the recess, such that a top surface of the carbon-based layer is below a top surface of the dielectric layer; etch the first barrier layer to remove a portion of the first barrier layer above the top surface of the carbon-based layer; remove the carbon-based layer to re-open the recess; form, using PVD, a second barrier layer over the first barrier layer and on sidewalls of the recess; and/or form an MIM structure in the recess. In another example, one or more of the semiconductor processing tools 102-116 and/or the wafer/die transport tool 118 may form a recess in a dielectric layer; form a first barrier layer on sidewalls and a bottom surface of the recess; form a carbon-based layer in the recess; etch a portion of the carbon-based layer, such that a top surface of a remaining portion of the carbon-based layer is below a top surface of the dielectric layer; etch the first barrier layer to remove a portion of the first barrier layer above the top surface of the remaining portion of the carbon-based layer; remove the remaining portion of the carbon-based layer to re-open the recess; form a second barrier layer over the first barrier layer and on sidewalls of the recess; and/or form a first metal in the recess, an insulator on the first metal, and a second metal on the insulator, such that the first metal, the insulator, and the second metal are an MIM structure.

The number and arrangement of tools shown in FIG. 1 are provided as one or more examples. In practice, there may be additional tools, fewer tools, different tools, or differently arranged tools than those shown in FIG. 1. Furthermore, two or more tools shown in FIG. 1 may be implemented within a single tool, or a single tool shown in FIG. 1 may be implemented as multiple, distributed tools. Additionally, or alternatively, a set of tools (e.g., one or more tools) of environment 100 may perform one or more functions described as being performed by another set of tools of environment 100.

Figure 2:
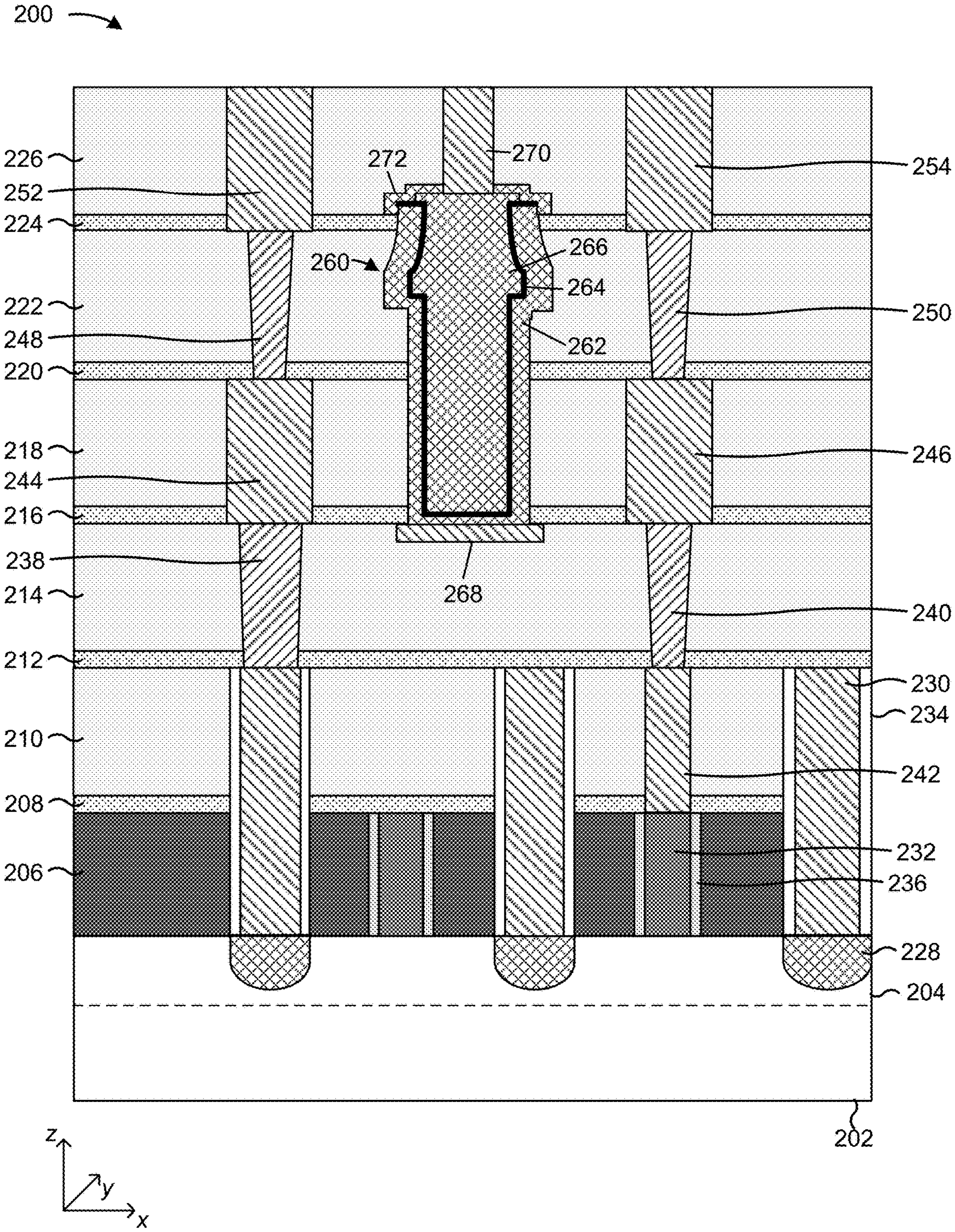
FIG. 2 is a diagram of an example semiconductor structure described herein.

FIG. 2 is a diagram of a portion of an example semiconductor structure 200 described herein. The semiconductor structure 200 may be included in a semiconductor device, such as a semiconductor memory device (e.g., a static random access memory (SRAM), a dynamic random access memory (DRAM)), an image sensor device (e.g., a complementary metal oxide semiconductor (CMOS) image sensor (CIS) device), a semiconductor logic device, a processor, an input/output device, or another type of semiconductor device that includes one or more transistors.

The semiconductor structure 200 includes one or more stacked layers. As shown in FIG. 2, the example semiconductor structure 200 includes a substrate 202. The substrate 202 may include a semiconductor die substrate, a semiconductor wafer, or another type of substrate in which semiconductor pixels may be formed. In some implementations, the substrate 202 is formed of silicon (Si), a material including silicon, a III-V compound semiconductor material such as gallium arsenide (GaAs), a silicon on insulator (SOI), or another type of semiconductor material that is capable of generating a charge from photons of incident light. In some implementations, the substrate 202 is formed of a doped material (e.g., a p-doped material or an n-doped material) such as a doped silicon. The substrate 202 may include a fin structure 204.

As further shown in FIG. 2, the example semiconductor structure 200 includes a dielectric layer 206, an etch stop layer (ESL) 208, a dielectric layer 210, an ESL 212, a dielectric layer 214, an ESL 216, a dielectric layer 218, an ESL 220, a dielectric layer 222, an ESL 224, and a dielectric layer 226, among other examples. The dielectric layers 206, 210, 214, 218, 222, and 226 are included to electrically isolate various structures of the semiconductor structure 200. The dielectric layers 206, 210, 214, 218, 222, and 226 include a silicon nitride ($SiN_x$), an oxide (e.g., a silicon oxide ($SiO_x$) and/or another oxide material), and/or another type of dielectric material. The ESLs 208, 212, 216, 220, 224 includes a layer of material that is configured to permit various portions of the semiconductor structure 200 (or the layers included therein) to be selectively etched or protected from etching to form one or more of the structures included in the semiconductor structure 200.

As further shown in FIG. 2, the semiconductor structure 200 includes a plurality of epitaxial (epi) regions 228 that are grown and/or otherwise formed on and/or around portions of the fin structure 204. The epitaxial regions 228 are formed by epitaxial growth. In some implementations, the epitaxial regions 228 are formed in recessed portions in the fin structure 204. The recessed portions may be formed by strained source drain (SSD) etching of the fin structure 204 and/or another type etching operation. The epitaxial regions 228 function as source or drain regions of the transistors included in the semiconductor structure 200.

The epitaxial regions 228 are electrically connected to metal source or drain contacts 230 of the transistors included in the semiconductor structure 200. The metal source or drain contacts (also referred to as "MDs" or "CAs") 230 include cobalt (Co), ruthenium (Ru), and/or another conductive or metal material. The transistors further include gates 232 (also referred to as "MGs"), which are formed of a polysilicon material, a metal (e.g., tungsten (W) or another metal), and/or another type of conductive material. The metal source or drain contacts 230 and the gates 232 are electrically isolated by one or more sidewall spacers, including spacers 234 in each side of the metal source or drain contacts 230 and spacers 236 on each side of the gate 232. The spacers 234 and 236 include a silicon oxide ($SiO_x$), a silicon nitride ($Si_xN_y$), a silicon oxy carbide (SiOC), a silicon oxycarbonitride (SiOCN), and/or another suitable material. In some implementations, the spacers 234 are omitted from the sidewalls of the source or drain contacts 230.

As further shown in FIG. 2, the metal source or drain contacts 230 and the gates 232 are electrically connected to one or more types of interconnects. The interconnects electrically connect the transistors of the semiconductor structure 200 and/or electrically connect the transistors to other areas and/or components of the semiconductor structure 200. In some implementations, the interconnects electrically connect the transistors to a BEOL region of the semiconductor structure 200.

The metal source or drain contacts 230 are electrically connected to source or drain interconnects 238 (e.g., also referred as to "source/drain vias" or "VDs"). One or more of the gates 232 are electrically connected to gate interconnects 240 (e.g., also referred to as "gate vias" or "VGs"). The interconnects 238 and 240 include a conductive material such as tungsten, cobalt, ruthenium, copper, and/or another type of conductive material. In some implementations, the gates 232 are electrically connected to the gate interconnects 240 by gate contacts 242 (CB or MP) to reduce contact resistance between the gates 232 and the gate interconnects 240. The gate contacts 242 include tungsten (W), cobalt (Co), ruthenium (Ru), titanium (Ti), aluminum (Al), copper (Cu) or gold (Au), among other examples of conductive materials.

As further shown in FIG. 2, the interconnects 238 and 240 are electrically connected to a plurality of BEOL layers, each including one or more metallization layers and/or vias. As an example, the interconnects 238 and 240 may be electrically connected to an M0 metallization layer that includes conductive structures 244 and 246. The M0 metallization layer is electrically connected to a V0 via layer that includes vias 248 and 250. The V0 via layer is electrically connected to an M1 metallization that includes conductive structures 252 and 254. In some implementations, the BEOL layers of the semiconductor structure 200 includes additional metallization layers and/or vias that connect the semiconductor structure 200 to a package. The BEOL region of the semiconductor structure 200 may refer to the region of the semiconductor structure 200 above the ESL 208, including the structures/layers 210-226 and 238-254.

As further shown in FIG. 2, the semiconductor structure 200 may include one or more devices and/or structures in the BEOL region of the semiconductor structure 200. For example, the semiconductor structure 200 may include one or more deep trench capacitor structures in the BEOL region of the semiconductor structure 200. The DTC structure(s) may be included in one or more of the dielectric layers 210, 214, 218, 222, and/or 226 in the BEOL region of the semiconductor structure 200.

A DTC structure may include an MIM structure 260 that includes a first metal 262, an insulator 264, and a second metal 266. The first metal 262 and the second metal 266 may correspond to the conductive electrode layers of the MIM structure 260. The first metal 262 may be referred to as the capacitor bottom metal (CBM) layer, and the second metal 266 may be referred to as the capacitor top metal (CTM) layer. The insulator 264 may be located between the first metal 262 and the second metal 266.

The first metal 262 and the second metal 266 may each include one or more electrically conductive materials. Examples include metals like tungsten (W), cobalt (Co), ruthenium (Ru), titanium (Ti), aluminum (Al), copper (Cu), or gold (Au), and metal nitrides like titanium nitride (TiN) or tantalum nitride (TaN), among other examples. The insulator 264 may include one or more electrically insulating and/or dielectric materials. In some implementations, the insulator 264 includes one or more dielectric materials having a relatively high dielectric constant (also referred to as a "high-K material"), such as a dielectric constant greater relative to the dielectric constant of silicon dioxide ($SiO_2$). Examples include oxides, such as zirconium oxide ($ZrO_x$ such as $ZrO_2$), aluminum oxide ($Al_xO_y$ such as $Al_2O_3$), silicon nitride ($Si_xN_y$ such as $Si_3N_4$), yttrium oxide ($Y_xO_y$ such as $Y_2O_3$), lanthanum oxide ($La_xO_y$ such as $La_2O_3$), yttrium titanium oxide ($Y_xTiO_y$ such as $Y_2TiO_5$), hafnium oxide ($HfO_x$ such as $HfO_2$), and/or tantalum oxide ($Ta_xO_y$ such as $Ta_2O_5$), among other examples.

As further shown in FIG. 2, the MIM structure 260 may be electrically connected with contacts that electrically connect the MIM structure 260 to other conductive structures in the semiconductor structure 200. A metallization layer 268, such as a copper metallization layer, may be located below and/or under the MIM structure 260. Additionally, and a top metal contact 270 may be located above and/or over the MIM structure 260. The metallization layer 268 may be electrically connected with the first metal 262 at the bottom of the MIM structure 260. The top metal contact 270 may be electrically connected with the second metal 266 at the top of the MIM structure 260.

As further shown in FIG. 2, a capping layer 272 may be included over the top of the MIM structure 260. The capping layer 272 may electrically isolate the MIM structure 260 from other structures in the dielectric layer 226. Additionally and/or alternatively, the capping layer 272 may function as a hard mask layer and/or an etch stop layer during manufacturing of the MIM structure 260.

As described in connection with FIG. 3, the MIM structure 260 may include a first barrier layer that prevents diffusion of copper (e.g., from the metallization layer 268) into the MIM structure 260. Additionally, the first barrier layer may have a U-shaped profile such that the first barrier layer only extends along a bottom portion of sidewalls of the dielectric layer 218 (and optionally the dielectric layer 222). As a result, the MIM structure 260 is formed with fewer voids, as described in connection with FIGS. 4A-4J, which increases capacitance of the MIM structure 260. Additionally, as described in connection with FIG. 3, the MIM structure 260 may include a second barrier layer between the first barrier layer and the MIM structure that improves resistance.

As indicated above, FIG. 2 is provided as an example. Other examples may differ from what is described with regard to FIG. 2.

Figure 3:
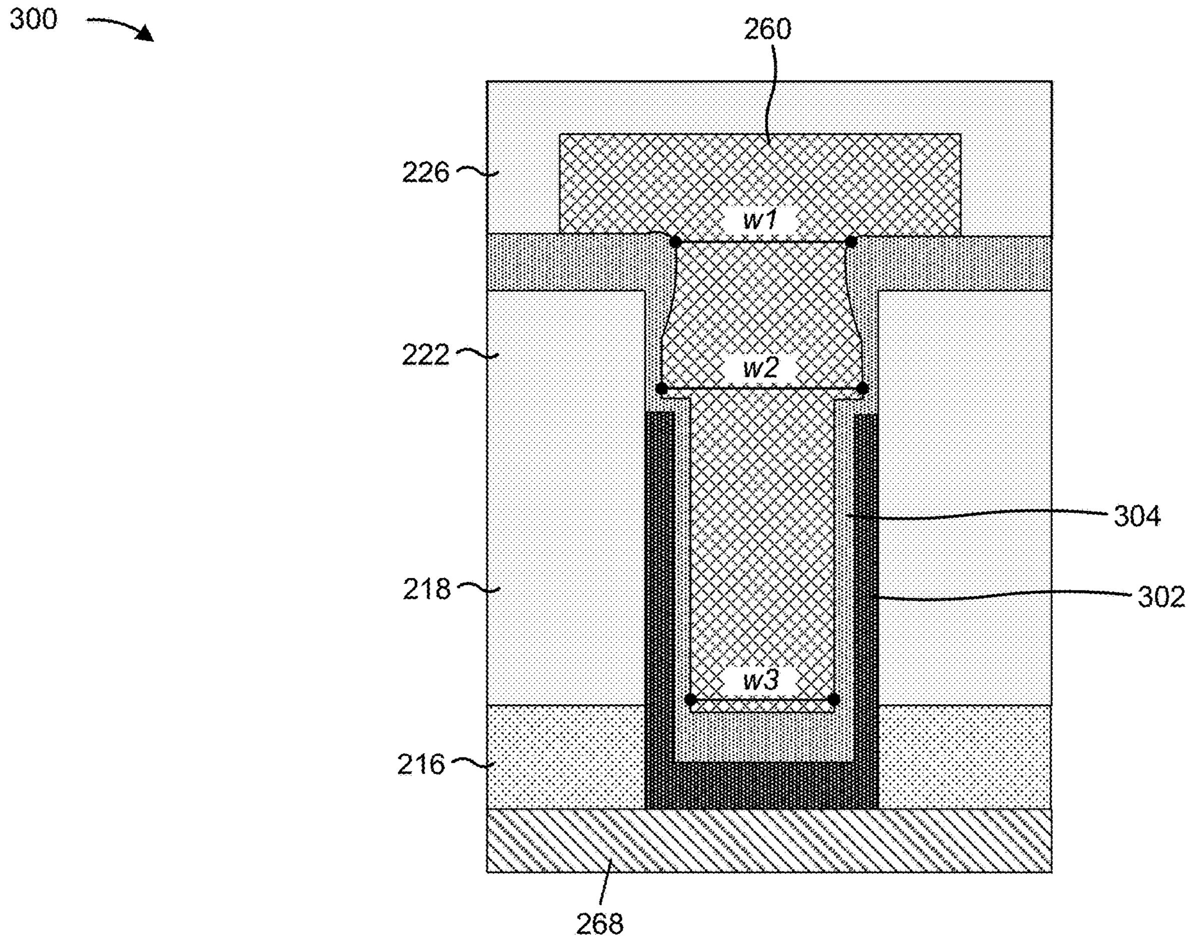
FIG. 3 is a diagram of an example semiconductor structure described herein.

FIG. 3 is a diagram of an example semiconductor structure 300 described herein. The example semiconductor structure 300 includes a U-shaped barrier layer for an MIM structure to improve capacitance. In some implementations, the example semiconductor structure 300 illustrated in FIG. 3 may be included in a processor, a memory, or another type of electronic device.

As shown in FIG. 3, an MIM structure 260 is formed in one or more dielectric layers of a BEOL (e.g., dielectric layer 218 and dielectric layer 222 in FIG. 3) above a metallization layer 268. In some implementations, an ESL 216 may provide resistance to etching the metallization layer 268 when forming the MIM structure 260. The ESL 216 may include a plurality of layers configured to function as an ESL together. Alternatively, the ESL 216 may be omitted from some implementations (e.g., when etching is time-based rather than ESL-based). Additionally, or alternatively, an ESL may be provided between the dielectric layer 218 and the dielectric layer 222 (e.g., ESL 220 of FIG. 2).

As further shown in FIG. 3, the example semiconductor structure 300 includes a first barrier layer 302 between the MIM structure 260 and the metallization layer 268. The first barrier layer 302 may include tantalum nitride (TaN), titanium nitride (TiN), molybdenum nitride (MoN), or aluminum nitride (AlN), among other examples. Accordingly, the first barrier layer 302 prevents diffusion of copper from the metallization layer 268 into the MIM structure 260.

Because the first barrier layer 302 is formed using PVD, as described in connection with FIG. 4C, the first barrier layer 302 may have a thickness in a range from approximately 100 Ångströms (Å) to approximately 400 Å. Using PVD may result in the first barrier layer 302 having a thickness of no less than 100 Å. Additionally, using a thickness of more than 400 Å increases resistance between the MIM structure 260 and the metallization layer 268 such that the MIM structure 260 would no longer be usable.

Furthermore, as shown in FIG. 3, the first barrier layer 302 is between the MIM structure 260 and the dielectric layer 218 and directly contacts sidewalls of the dielectric layer 218 (e.g., a first portion, such as a lower portion, of the sidewalls of the dielectric layers 218 and 222). However, the first barrier layer 302 does not contact sidewalls of the dielectric layer 222 (e.g., a second portion, such as an upper portion, of the sidewalls of the dielectric layers 218 and 222). In other words, the first barrier layer 302 exhibits a "U-shaped" profile because the first barrier layer 302 contacts a surface of the metallization layer 268 and a bottom portion of sidewalls of the dielectric layers 218 and 222. The U-shaped profile is caused by selective etching of the first barrier layer 302, as described in connection with FIG. 4F.

As further shown in FIG. 3, the example semiconductor structure 300 includes a second barrier layer 304 between the MIM structure 260 and the first barrier layer 302. The second barrier layer 304 may include tantalum (Ta), ruthenium (Ru), cobalt (Co), or a ruthenium-cobalt alloy (RuCo), among other examples. Accordingly, the second barrier layer 304 reduces resistance that would otherwise be caused by contact between the first barrier layer 302 and the MIM structure 260.

Because the second barrier layer 304 is formed using PVD, as described in connection with FIG. 4H, the second barrier layer 304 may have a thickness in a range from approximately 100 Å to approximately 400 Å. Using PVD may result in the second barrier layer 304 having a thickness of no less than 100 Å. Additionally, using a thickness of more than 400 Å reduces a volume, and thus a capacitance, of the MIM structure 260 such that the MIM structure 260 would no longer be useful.

Additionally, the first barrier layer 302 and the second barrier layer 304 have a total thickness, at a bottom surface of the MIM structure 260, in a range from approximately 60 Å to approximately 800 Å. Using less than 60 Å of material allows copper diffusion into the MIM structure 260, such that the MIM structure 260 will eventually no longer function. Using more than 800 Å of material will increase resistance for, and reduce capacitance of, the MIM structure 260 such that the MIM structure 260 would no longer be usable.

Because the second barrier layer 304 is formed using PVD and thus has increased buildup at corners of the dielectric layer 222, a width of the MIM structure 260 along a top surface of the dielectric layer 222 (e.g., represented by w1 in FIG. 3) is smaller than a width of the MIM structure 260 at a point between the top surface of the dielectric layer 222 and a bottom surface of the MIM structure 260 (e.g., represented by w2 in FIG. 3). In other words, the MIM structure 260 is wider at a middle point than at a top point.

Additionally, because the first and second barrier layers 302 and 304 are present, the width of the MIM structure 260 along the top surface of the dielectric layer 222 (e.g., represented by w1 in FIG. 3) is larger than a width of the MIM structure 260 along the bottom surface of the MIM structure 260 (e.g., represented by w3 in FIG. 3). In other words, the MIM structure 260 is thinner at a bottom point than at the top point.

Because the first barrier layer 302 has a U-shaped profile, the width of the MIM structure 260 at the point between the top surface of the dielectric layer 222 and the bottom surface of the MIM structure 260 (e.g., represented by w2 in FIG. 3) is larger than the width of the MIM structure 260 along the bottom surface of the MIM structure 260 (e.g., represented by w3 in FIG. 3). In other words, the MIM structure 260 is thinner at a bottom point than at the middle point.

As indicated above, FIG. 3 is provided as an example. Other examples may differ from what is described with regard to FIG. 3. For example, the MIM structure 260 may be formed in a single dielectric layer of the BEOL or across three or more dielectric layers of the BEOL. Alternatively, the MIM structure 260 may be formed in an MEOL (e.g., dielectric layer 214 of FIG. 2).

FIGS. 4A-4J are diagrams of an example implementation 400 described herein. Example implementation 400 may be an example process for forming the example semiconductor structure 300 having an MIM structure with a U-shaped barrier layer. The semiconductor structure formed using example implementation 400 may be included in a processor, a memory, or another type of electronic device.

Figure 4A:
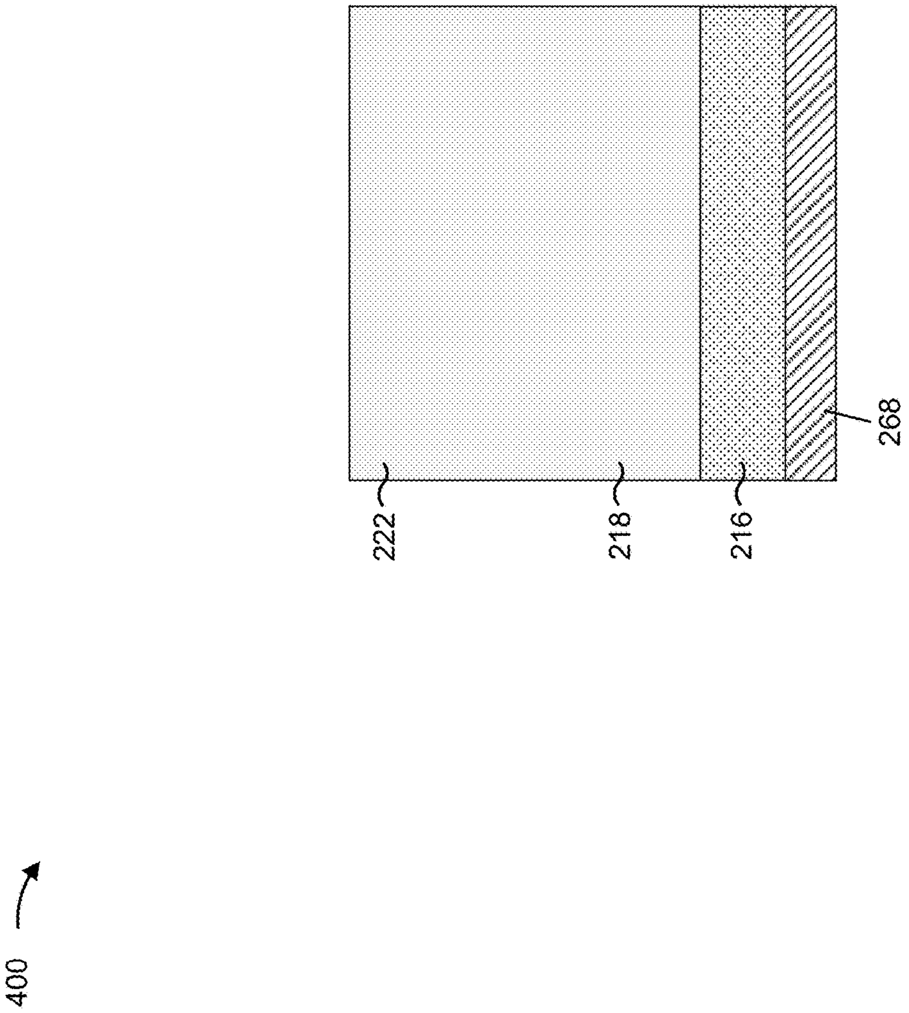
FIGS. 4A-4J are diagrams of an example implementation described herein.

As shown in FIG. 4A, the example process for forming the semiconductor structure may be performed in connection with a metallization layer 268. The metallization layer 268 may be formed of copper.

As further shown in FIG. 4A, the example process may further be performed in connection with an ESL 216, a dielectric layer 218, and a dielectric layer 222, among other examples. For example, the deposition tool 102 may form the ESL 216, the dielectric layer 218, and the dielectric layer 222 over and/or on the frontside surface of the metallization layer 268. In some implementations, the deposition tool 102 may form the ESL 216, the dielectric layer 218, and the dielectric layer 222 using a spin-coating technique, a CVD technique, a PVD technique, an ALD technique, and/or another deposition technique.

Figure 4B:
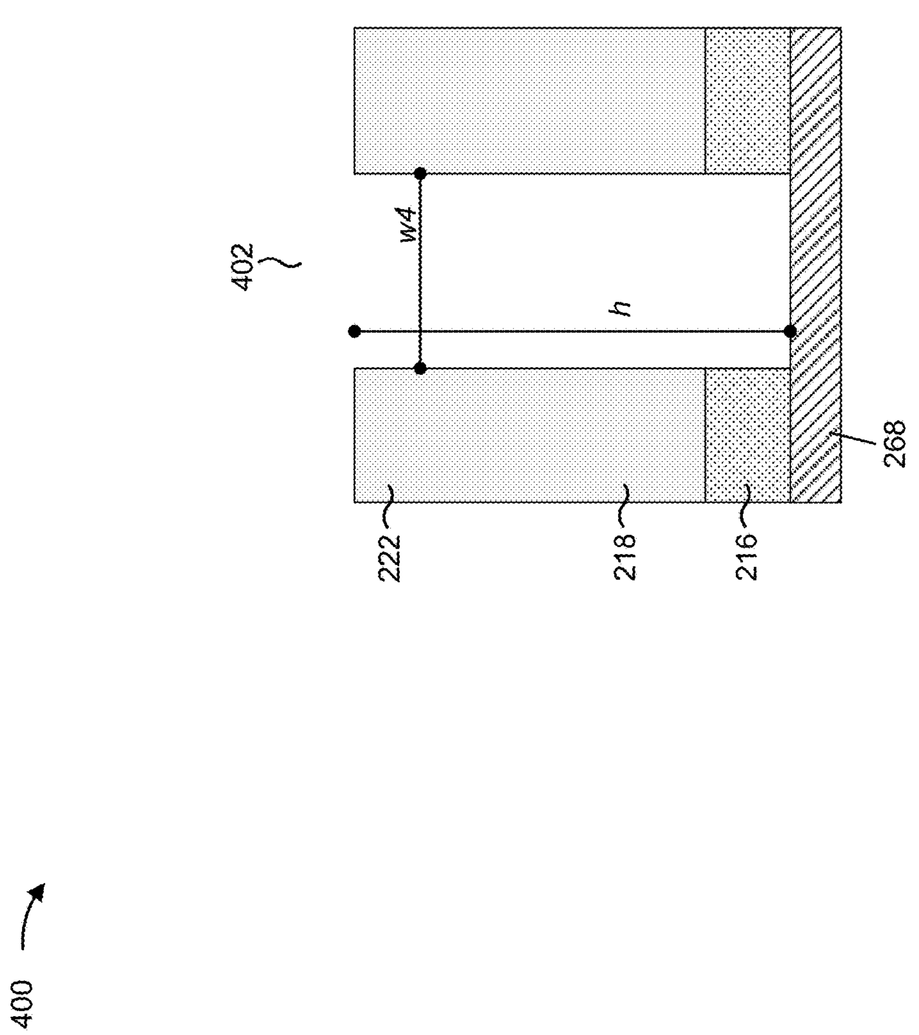

As shown in FIG. 4B, a recess 402 may be formed in the dielectric layers 218 and 222. For example, the etch tool 108 may form the recess 402 to expose a surface of the metallization layer 268. In some implementations, the deposition tool 102 may form a photoresist layer over and/or on the frontside surface of the dielectric layer 222, the exposure tool 104 may expose the photoresist layer to a radiation source to form a pattern on the photoresist layer, and the developer tool 106 may develop and remove portions of the photoresist layer to expose the pattern. Accordingly, the etch tool 108 may etch a portion of the dielectric layers 218 and 222 above the metallization layer 268. For example, the etch tool 108 may use a wet etch technique, a dry etch technique, a plasma-enhanced etch technique, and/or another type of etch technique to etch the portion of the dielectric layers 218 and 222. The photoresist removal tool 114 may remove the remaining portions of the photoresist layer (e.g., using a chemical stripper, a plasma asher, and/or another technique) after the etch tool 108 etches the dielectric layers 218 and 222. In some implementations, the ESL 216 may be removed from the recess 402 by the etch tool 108 using a separate etch process.

As further shown in FIG. 4B, the recess 402 may have a width (e.g., represented by w4) in a range from approximately 0.11 micrometers (μm) to approximately 0.17 μm. Using a width of less than 0.11 μm causes an MIM structure 260 formed in the recess 402 (e.g., as described in connection with FIG. 4I) to have too many voids and thus no longer usable. Using a width of more than 0.17 μm causes the MIM structure 260 formed in the recess 402 (e.g., as described in connection with FIG. 4I) to be too large for many applications (e.g., based on miniaturization requirements).

As further shown in FIG. 4B, the recess 402 may have a height (e.g., represented by h) in a range from approximately 1.5 μm to approximately 2.0 μm. Using a height of less than 1.5 μm causes an MIM structure 260 formed in the recess 402 (e.g., as described in connection with FIG. 4I) to have too small of a capacitance to be useful. Using a height of more than 2.0 μm causes the MIM structure 260 formed in the recess 402 (e.g., as described in connection with FIG. 4I) to be too large for many applications (e.g., based on miniaturization requirements).

Accordingly, a ratio of a width (e.g., represented by w4 in FIG. 4B) of the recess 402 to a height (e.g., represented by h in FIG. 4B) of the recess 402 is in a range from approximately 0.05 to approximately 0.12. Using a ratio of at least 0.05 ensures that the MIM structure 260 formed in the recess 402 (e.g., as described in connection with FIG. 4I) will not have too many voids. Using a ratio of no more than 0.12 ensures that the MIM structure 260 formed in the recess 402 (e.g., as described in connection with FIG. 4I) will not be too large for most applications (e.g., based on miniaturization requirements).

Figure 4C:
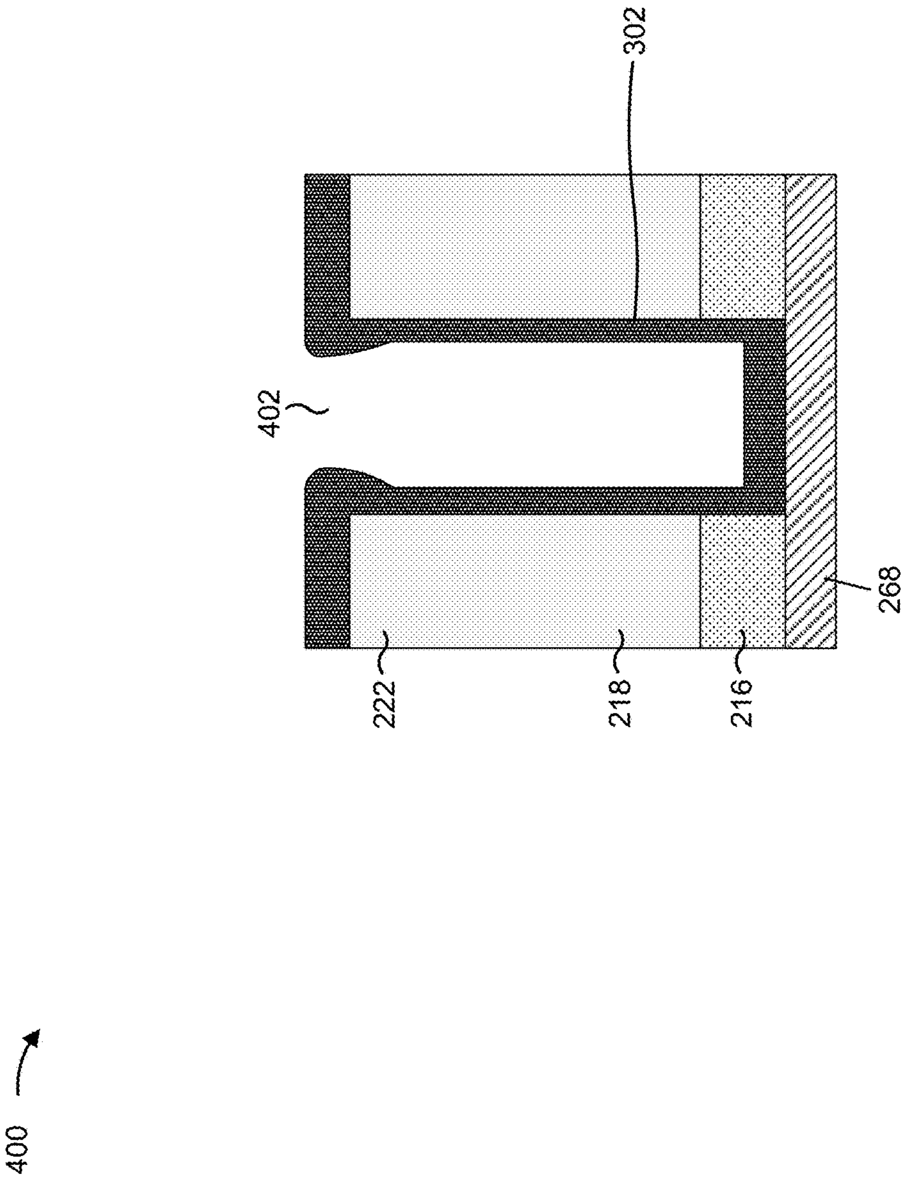

As shown in FIG. 4C, a first barrier layer 302 may be formed in the recess 402. For example, the deposition tool 102 may form the first barrier layer 302 on the exposed surface of the metallization layer 268, sidewalls of the dielectric layers 218 and 222, and a top surface of the dielectric layer 222. In some implementations, the deposition tool 102 may form the first barrier layer 302 using a PVD technique. As a result, the first barrier layer 302 may be thicker near corners of the dielectric layer 222, as shown in FIG. 4C.

Because the first barrier layer 302 is formed using PVD, the first barrier layer 302 may be characterized as "carbon-free." As used herein, "carbon-free" refers to having approximately 0% within a layer. A layer may include trace amounts of carbon on a surface of the layer but not within the layer itself (e.g., no more than approximately 10 Å into the layer). Using ALD would instead result in detectable carbon within the first barrier layer 302 caused by a carbon-based precursor used to deposit material of the first barrier layer 302. The detectable carbon increases resistance of the first barrier layer 302, which reduces performance of the MIM structure 260.

Figure 4D:
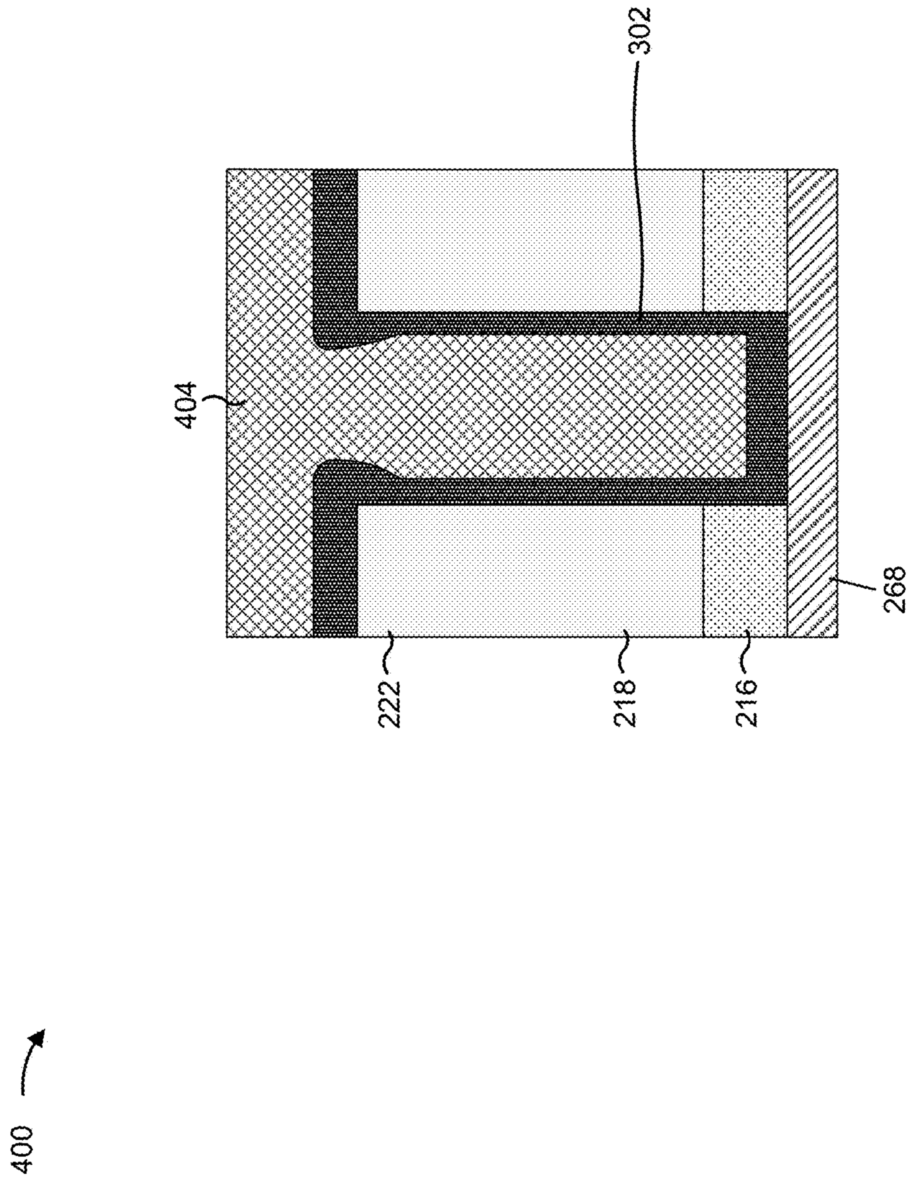

In order to provide for partial etching of the first barrier layer 302, a carbon-based layer 404 may be formed in the recess 402, as shown in FIG. 4D. The carbon-based layer 404 may be a BARC. The deposition tool 102 may form the carbon-based layer 404 in the recess 402 and over the top surface of the dielectric layer 222. In some implementations, the deposition tool 102 may form the carbon-based layer 404 using a spin-coating technique, a CVD technique, a PVD technique, an ALD technique, and/or another deposition technique.

Figure 4E:
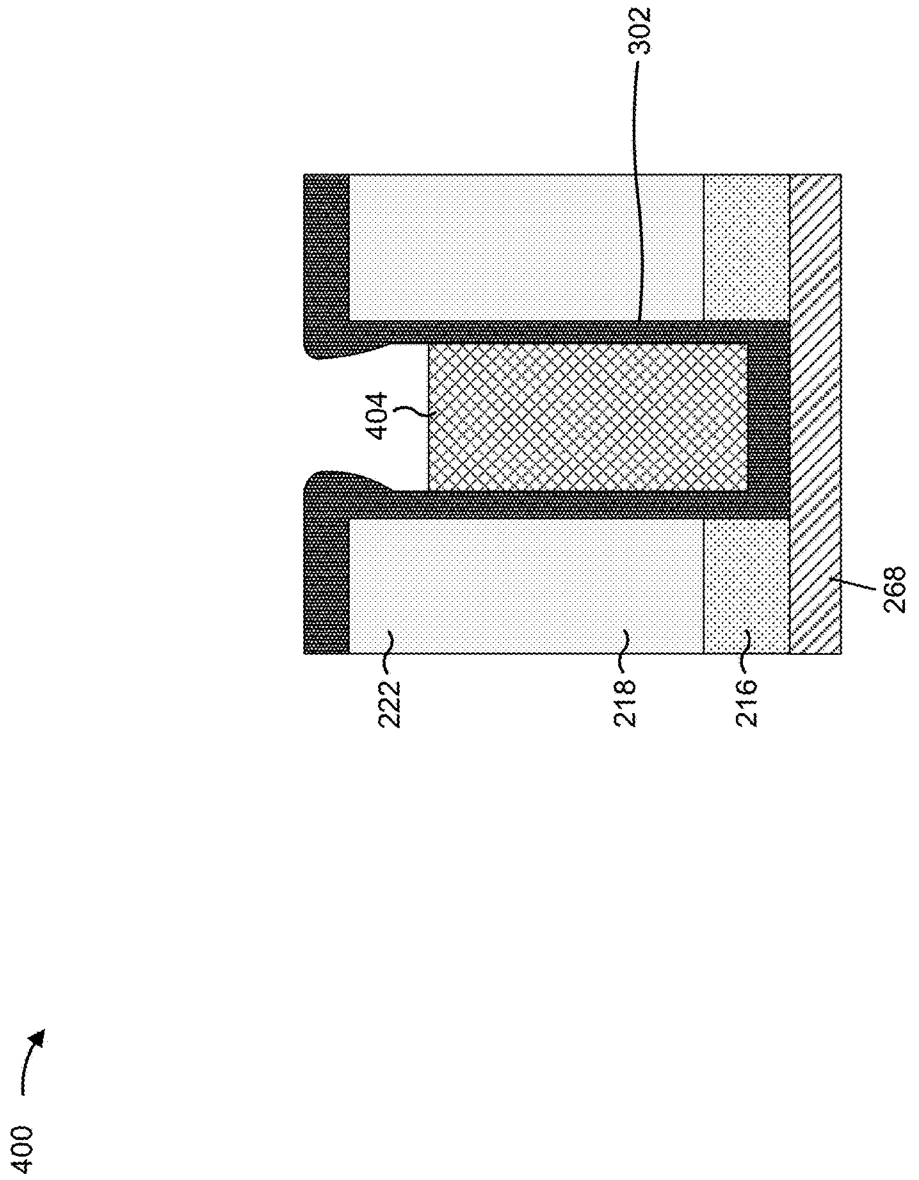

As shown in FIG. 4E, the carbon-based layer 404 is partially etched such that a top surface of the carbon-based layer is below a top surface of the dielectric layer 222. For example, the etch tool 108 may perform an etch process for an amount of time that satisfies a time threshold. The time threshold may be calculated to reduce the top surface for the carbon-based layer 404 below the top surface of the dielectric layer 222. Additionally, a portion of the carbon-based layer 404 that is outside the recess 402 is removed. The etch tool 108 may a perform a gamma ashing using nitrogen ($N_2$), hydrogen ($H_2$), or a combination thereof.

Figure 4F:
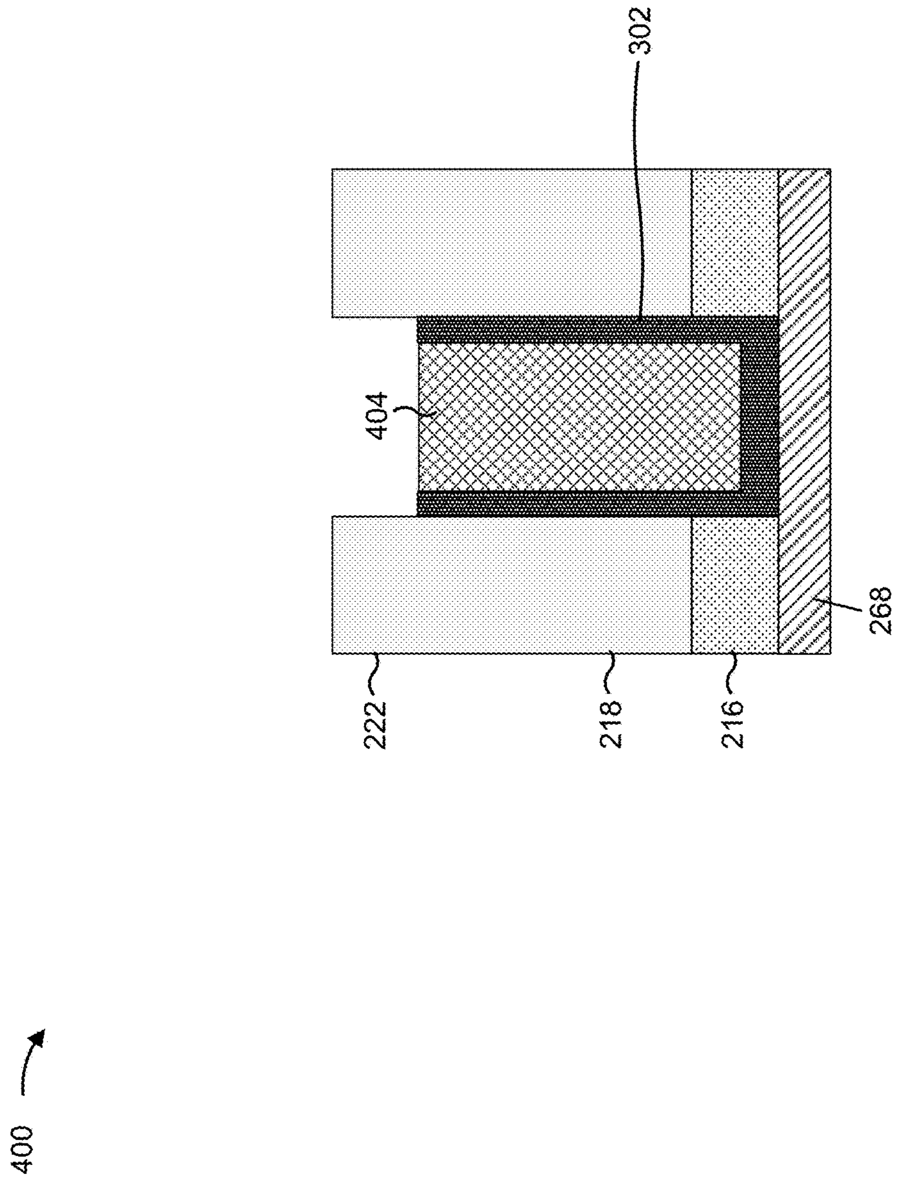

As shown in FIG. 4F, the first barrier layer 302 is partially etched such that a top surface of the first barrier layer 302 is adjacent to a top surface of the carbon-based layer 404. Additionally, a portion of the first barrier layer 302 that is outside the recess 402 is removed. The etch tool 108 may a perform a dry etch using a chlorine-based (Cl-based) chemical.

Figure 4G:
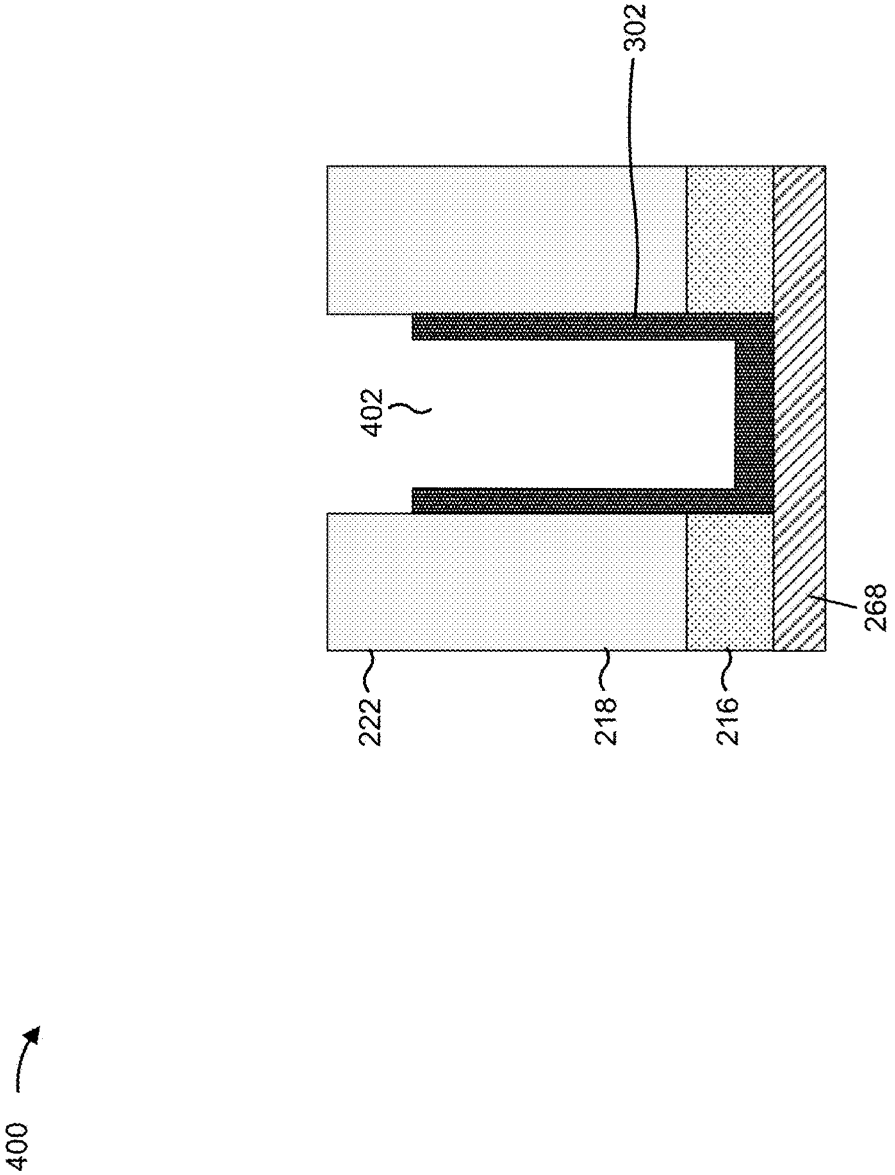

As shown in FIG. 4G, the carbon-based layer 404 may be removed. For example, the recess 402 may be re-opened. The etch tool 108 may a perform a gamma ashing using nitrogen ($N_2$), hydrogen ($H_2$), or a combination thereof. The ashing may be performed at a temperature in a range from approximately 300 degrees Celsius (° C.) to approximately 400° C. Using a temperature of at least 300° C. removes all of the carbon-based layer 404. Using a temperature of no more than 400° C. prevents damage to the dielectric layer 222 and the first barrier layer 302. The ashing may be performed at a pressure in a range from approximately 3 torr to approximately 10 torr. Using a pressure of at least 3 torr removes all of the carbon-based layer 404. Using a pressure of no more than 10 torr prevents oxidation of the first barrier layer 302 during the ashing.

In some implementations, a plasma treatment (e.g., using hydrogen ($H_2$)) may be performed on the first barrier layer 302. For example, the first barrier layer 302 may be partially oxidized when moving between the etch tool 108 (as described in connection with FIG. 4G) and the deposition tool 102 (as described in connection with FIG. 4H). Accordingly, the plasma treatment may remove oxygen from a surface of the first barrier layer 302, which reduces resistance of the first barrier layer 302 and thus improves performance of the MIM structure 260.

Figure 4H:
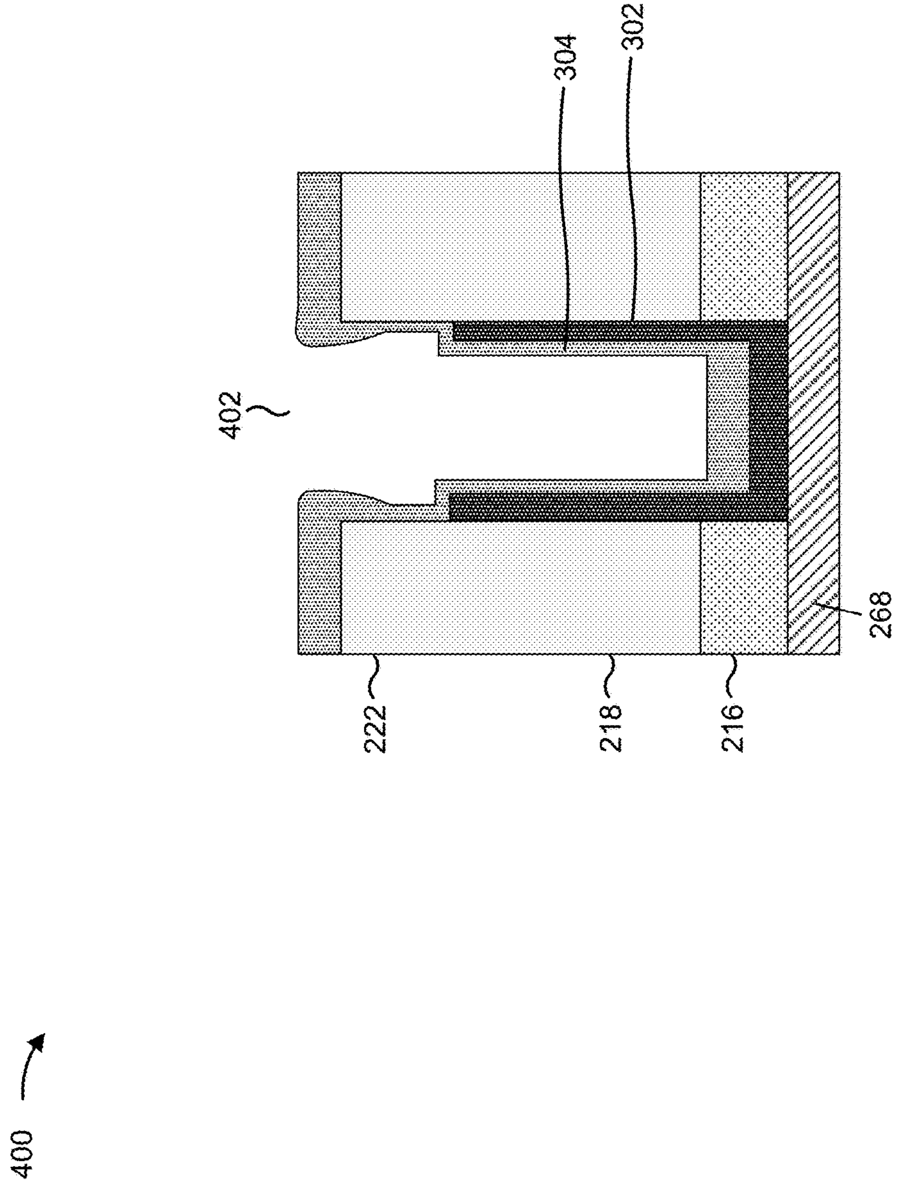

As shown in FIG. 4H, a second barrier layer 304 may be formed in the recess 402. For example, the deposition tool 102 may form the second barrier layer 304 on the first barrier layer 302, sidewalls of the dielectric layers 218 and 222 not contacted by the first barrier layer 302, and a top surface of the dielectric layer 222. In some implementations, the deposition tool 102 may form the second barrier layer 304 using a PVD technique. As a result, the second barrier layer 304 may be thicker near corners of the dielectric layer 222, as shown in FIG. 4H.

Figure 4I:
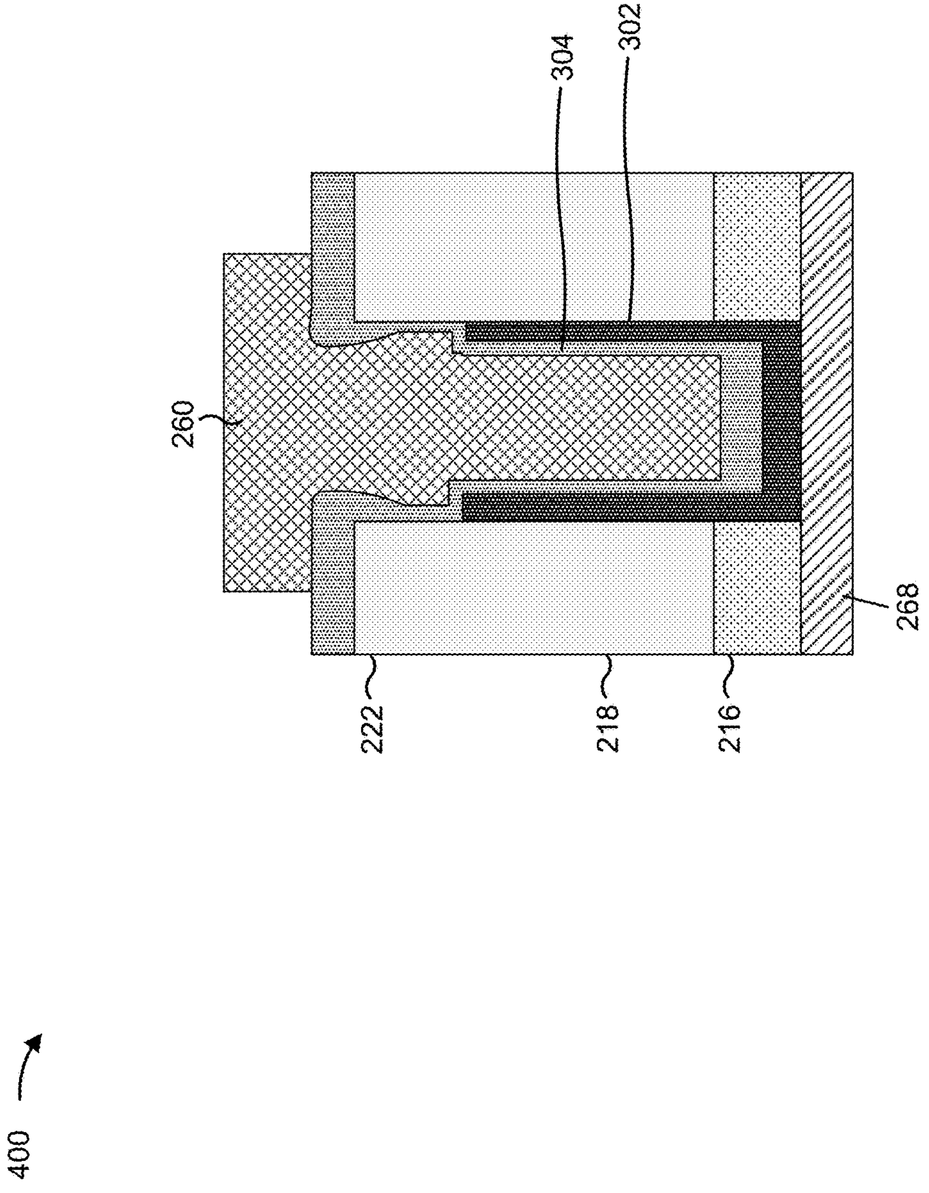

As shown in FIG. 4I, the MIM structure 260 may be formed in the recess 402. For example, the deposition tool 102 may form a first metal 262 in the recess 402, form an insulator 264 on the first metal 262, and form a second metal 266 on the insulator 264. Therefore, the MIM structure 260 may include the first metal 262, the insulator 264, and the second metal 266. In some implementations, the deposition tool 102 may form the MIM structure 260 using a spin-coating technique, a CVD technique, a PVD technique, an ALD technique, and/or another deposition technique.

Figure 4J:
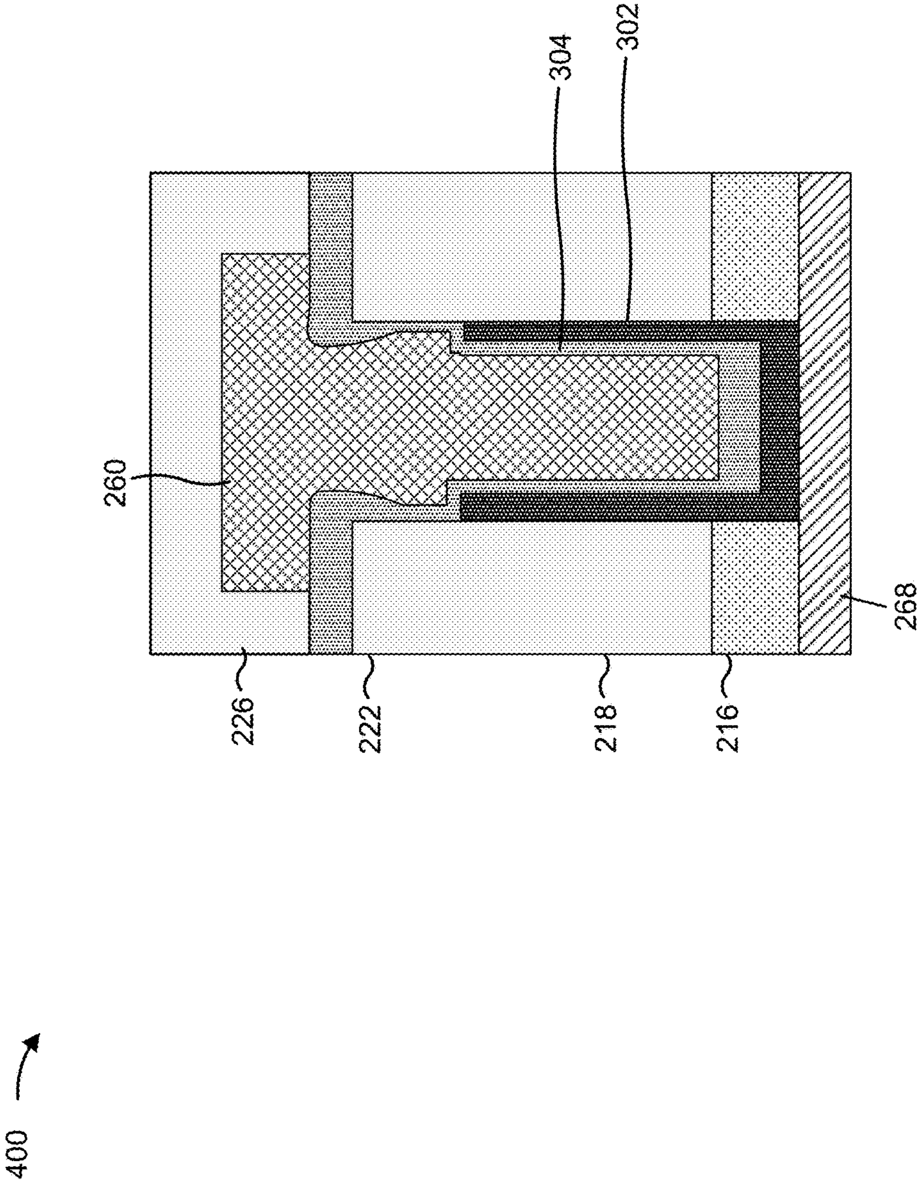

As shown in FIG. 4J, a dielectric layer 226 may be formed over the MIM structure 260. For example, the deposition tool 102 may form the dielectric layer 226 over and/or on the frontside surface of the MIM structure 260. In some implementations, the deposition tool 102 may form the dielectric layer 226 using a spin-coating technique, a CVD technique, a PVD technique, an ALD technique, and/or another deposition technique. In some implementations, the deposition tool 102 may additionally form a top metal contact 270 and/or a capping layer 272 over the MIM structure 260 (e.g., as described in connection with FIG. 2).

As indicated above, FIGS. 4A-4J are provided as an example. Other examples may differ from what is described with regard to FIGS. 4A-4J. For example, the MIM structure 260 may be formed in a single dielectric layer of the BEOL or across three or more dielectric layers of the BEOL. Alternatively, the MIM structure 260 may be formed in an MEOL (e.g., dielectric layer 214 of FIG. 2). In another example, an ESL may be provided between the dielectric layer 218 and the dielectric layer 222 (e.g., ESL 220 of FIG. 2). Accordingly, the recess 402 may be formed using a dual damascene process.

Figure 5:
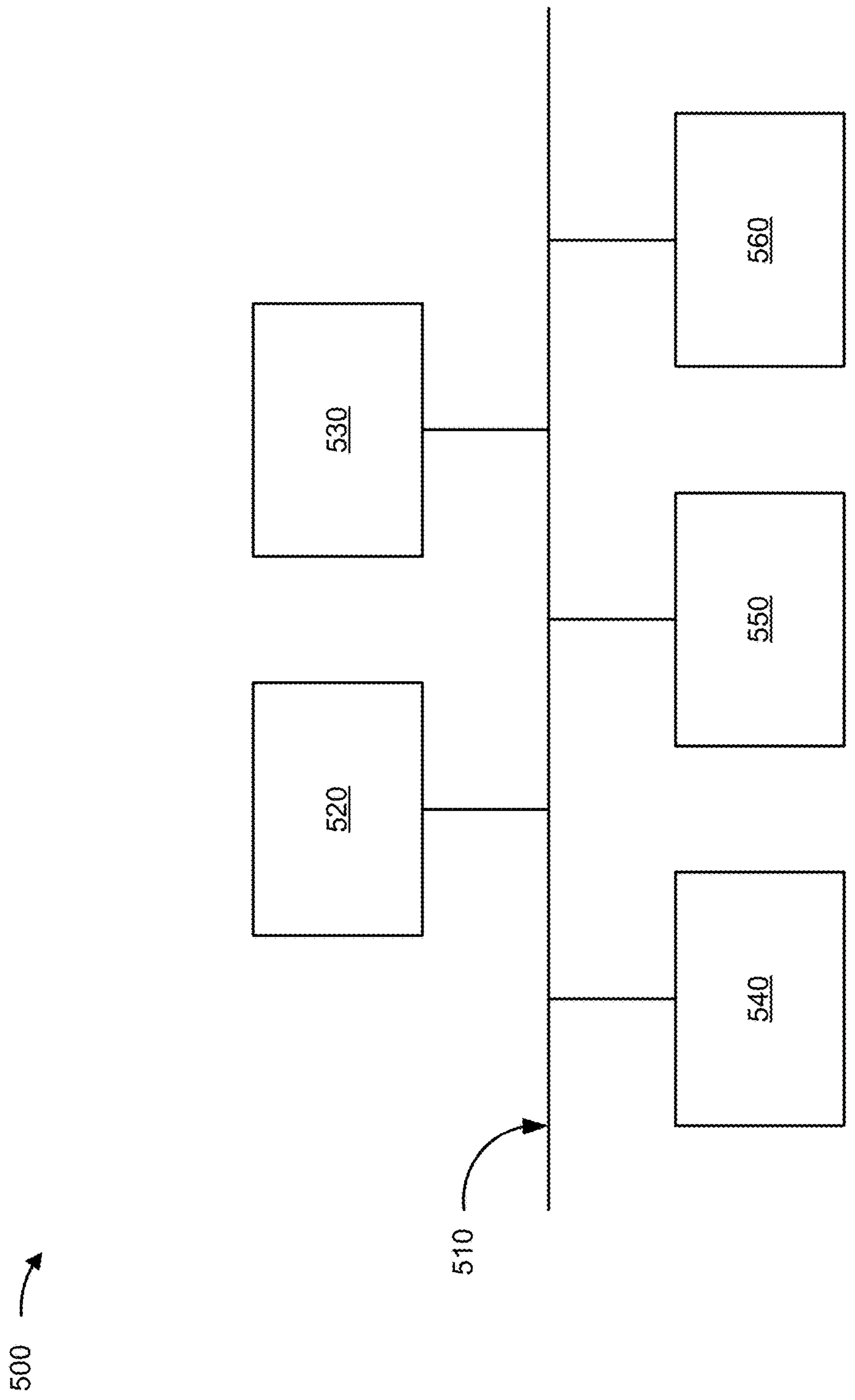
FIG. 5 is a diagram of example components of one or more devices of FIG. 1 described herein.

FIG. 5 is a diagram of example components of a device 500 described herein. In some implementations, one or more of the semiconductor processing tools 102-116 and/or the wafer/die transport tool 118 may include one or more devices 500 and/or one or more components of device 500. As shown in FIG. 5, device 500 may include a bus 510, a processor 520, a memory 530, an input component 540, an output component 550, and a communication component 560.

Bus 510 may include one or more components that enable wired and/or wireless communication among the components of device 500. Bus 510 may couple together two or more components of FIG. 5, such as via operative coupling, communicative coupling, electronic coupling, and/or electric coupling. Processor 520 may include a central processing unit, a graphics processing unit, a microprocessor, a controller, a microcontroller, a digital signal processor, a field-programmable gate array, an application-specific integrated circuit, and/or another type of processing component. Processor 520 is implemented in hardware, firmware, or a combination of hardware and software. In some implementations, processor 520 may include one or more processors capable of being programmed to perform one or more operations or processes described elsewhere herein.

Memory 530 may include volatile and/or nonvolatile memory. For example, memory 530 may include random access memory (RAM), read only memory (ROM), a hard disk drive, and/or another type of memory (e.g., a flash memory, a magnetic memory, and/or an optical memory). Memory 530 may include internal memory (e.g., RAM, ROM, or a hard disk drive) and/or removable memory (e.g., removable via a universal serial bus connection). Memory 530 may be a non-transitory computer-readable medium. Memory 530 stores information, instructions, and/or software (e.g., one or more software applications) related to the operation of device 500. In some implementations, memory 530 may include one or more memories that are coupled to one or more processors (e.g., processor 520), such as via bus 510.

Input component 540 enables device 500 to receive input, such as user input and/or sensed input. For example, input component 540 may include a touch screen, a keyboard, a keypad, a mouse, a button, a microphone, a switch, a sensor, a global positioning system sensor, an accelerometer, a gyroscope, and/or an actuator. Output component 550 enables device 500 to provide output, such as via a display, a speaker, and/or a light-emitting diode. Communication component 560 enables device 500 to communicate with other devices via a wired connection and/or a wireless connection. For example, communication component 560 may include a receiver, a transmitter, a transceiver, a modem, a network interface card, and/or an antenna.

Device 500 may perform one or more operations or processes described herein. For example, a non-transitory computer-readable medium (e.g., memory 530) may store a set of instructions (e.g., one or more instructions or code) for execution by processor 520. Processor 520 may execute the set of instructions to perform one or more operations or processes described herein. In some implementations, execution of the set of instructions, by one or more processors 520, causes the one or more processors 520 and/or the device 500 to perform one or more operations or processes described herein. In some implementations, hardwired circuitry is used instead of or in combination with the instructions to perform one or more operations or processes described herein. Additionally, or alternatively, processor 520 may be configured to perform one or more operations or processes described herein. Thus, implementations described herein are not limited to any specific combination of hardware circuitry and software.

The number and arrangement of components shown in FIG. 5 are provided as an example. Device 500 may include additional components, fewer components, different components, or differently arranged components than those shown in FIG. 5. Additionally, or alternatively, a set of components (e.g., one or more components) of device 500 may perform one or more functions described as being performed by another set of components of device 500.

Figure 6:
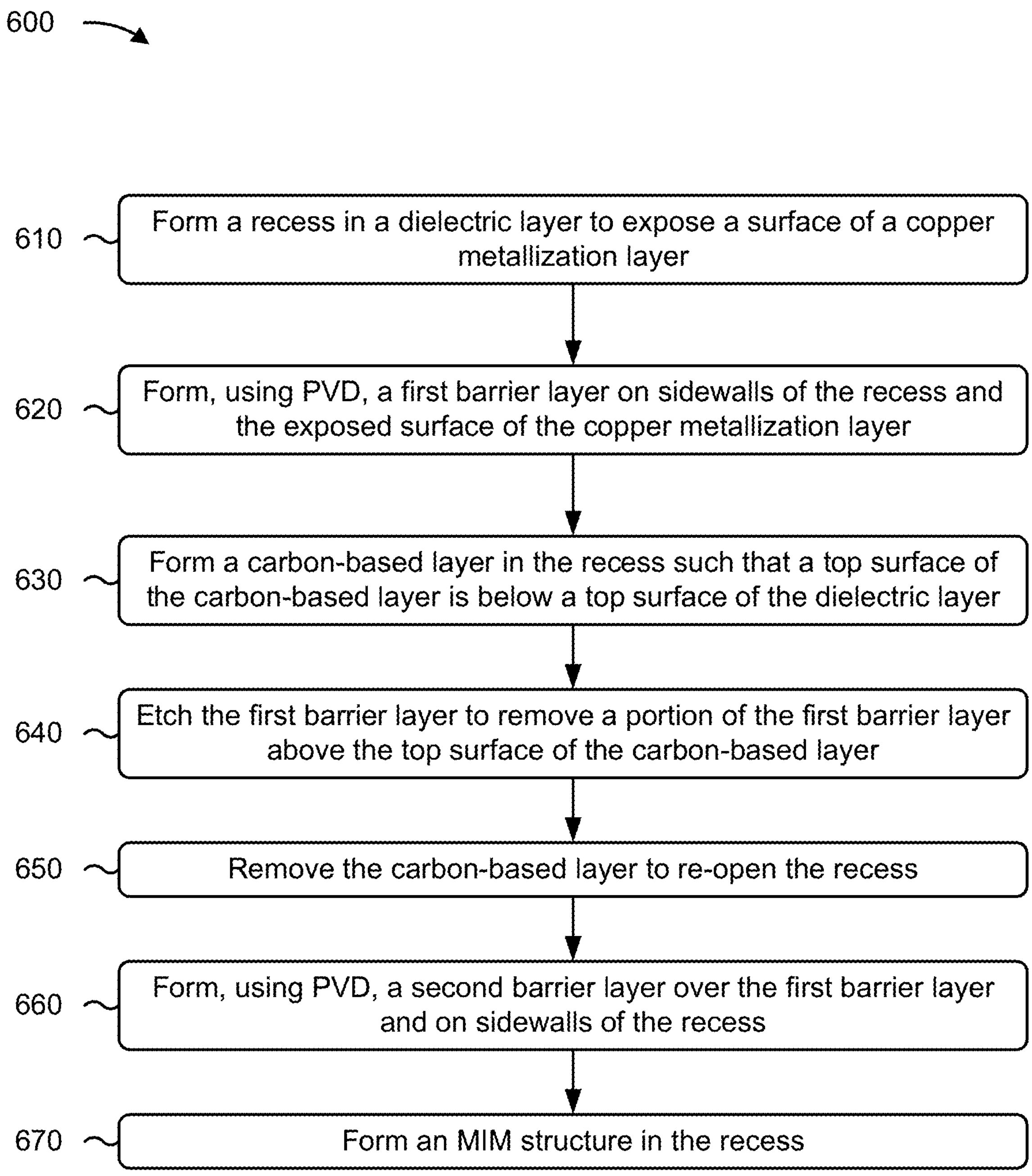
FIG. 6 is a flowchart of an example process associated with forming a semiconductor structure described herein.

FIG. 6 is a flowchart of an example process 600 associated with forming a semiconductor structure described herein. In some implementations, one or more process blocks of FIG. 6 are performed by one or more semiconductor processing tools (e.g., one or more of the semiconductor processing tools 102-116). Additionally, or alternatively, one or more process blocks of FIG. 6 may be performed by one or more components of device 500, such as processor 520, memory 530, input component 540, output component 550, and/or communication component 560.

As shown in FIG. 6, process 600 may include forming a recess in a dielectric layer to expose a surface of a copper metallization layer (block 610). For example, one or more of the semiconductor processing tools 102-116 may form a recess 402 in a dielectric layer 218 and/or 222 to expose a surface of a copper metallization layer 268, as described herein.

As further shown in FIG. 6, process 600 may include forming, using PVD, a first barrier layer on sidewalls of the recess and the exposed surface of the copper metallization layer (block 620). For example, one or more of the semiconductor processing tools 102-116 may form, using PVD, a first barrier layer 302 on sidewalls of the recess 402 and the exposed surface of the copper metallization layer 268, as described herein.

As further shown in FIG. 6, process 600 may include forming a carbon-based layer in the recess such that a top surface of the carbon-based layer is below a top surface of the dielectric layer (block 630). For example, one or more of the semiconductor processing tools 102-116 may form a carbon-based layer 404 in the recess 402 such that a top surface of the carbon-based layer 404 is below a top surface of the dielectric layer 218 and/or 222, as described herein.

As further shown in FIG. 6, process 600 may include etching the first barrier layer to remove a portion of the first barrier layer above the top surface of the carbon-based layer (block 640). For example, one or more of the semiconductor processing tools 102-116 may etch the first barrier layer 302 to remove a portion of the first barrier layer 302 above the top surface of the carbon-based layer 404, as described herein.

As further shown in FIG. 6, process 600 may include removing the carbon-based layer to re-open the recess (block 650). For example, one or more of the semiconductor processing tools 102-116 may remove the carbon-based layer 404 to re-open the recess 402, as described herein.

As further shown in FIG. 6, process 600 may include forming, using PVD, a second barrier layer over the first barrier layer and on sidewalls of the recess (block 660). For example, one or more of the semiconductor processing tools 102-116 may form, using PVD, a second barrier layer 304 over the first barrier layer 302 and on sidewalls of the recess 402, as described herein.

As further shown in FIG. 6, process 600 may include forming an MIM structure in the recess (block 670). For example, one or more of the semiconductor processing tools 102-116 may form an MIM 260 structure in the recess 402, as described herein.

Process 600 may include additional implementations, such as any single implementation or any combination of implementations described below and/or in connection with one or more other processes described elsewhere herein.

In a first implementation, a ratio of a width of the recess 402 to a height of the recess 402 is in a range from approximately 0.05 to approximately 0.12.

In a second implementation, alone or in combination with the first implementation, removing the carbon-based layer 404 includes performing a gamma ashing using nitrogen, hydrogen, or a combination thereof.

In a third implementation, alone or in combination with one or more of the first and second implementations, etching the first barrier layer 302 includes performing a dry etching using a chlorine-based chemical.

In a fourth implementation, alone or in combination with one or more of the first through third implementations, process 600 includes performing a plasma treatment on the first barrier layer 302 before forming the second barrier layer 304.

In a fifth implementation, alone or in combination with one or more of the first through fourth implementations, process 600 includes etching a portion of the carbon-based layer 404 such that a top surface of a remaining portion of the carbon-based layer 404 is below a top surface of the dielectric layer 218 and/or 222.

In a sixth implementation, alone or in combination with one or more of the first through fifth implementations, forming the MIM structure 260 in the recess 402 includes forming a first metal 262 in the recess 402, an insulator 264 on the first metal 262, and a second metal 266 on the insulator 264, where the first metal 262, the insulator 264, and the second metal 266 comprise the MIM structure 260.

In a seventh implementation, alone or in combination with one or more of the first through sixth implementations, a width of the recess 402 is in a range from approximately 0.11 μm to approximately 0.17 μm.

In an eighth implementation, alone or in combination with one or more of the first through seventh implementations, a height of the recess 402 is in a range from approximately 1.5 μm to approximately 2.0 μm.

In a ninth implementation, alone or in combination with one or more of the first through eighth implementations, process 600 includes etching a portion of the carbon-based layer 404 by performing a gamma ashing using nitrogen, hydrogen, or a combination thereof.

In a tenth implementation, alone or in combination with one or more of the first through ninth implementations, forming the MIM structure 260 in the recess 402 includes forming a first metal 262 using PVD, forming an insulator 264, using PVD, that includes a plurality of oxide materials, and forming a second metal 266 using PVD.

In an eleventh implementation, alone or in combination with one or more of the first through fourth implementations, a first metal 262 of the MIM structure 260 and a second metal 266 of the MIM structure 260 include titanium nitride, and an insulator 264 of the MIM structure 260 includes zirconium oxide or aluminum oxide.

Although FIG. 6 shows example blocks of process 600, in some implementations, process 600 includes additional blocks, fewer blocks, different blocks, or differently arranged blocks than those depicted in FIG. 6. Additionally, or alternatively, two or more of the blocks of process 600 may be performed in parallel.

In this way, forming a barrier layer and removing the barrier layer from an upper portion of a recess in which an MIM structure will be formed allows for forming the MIM structure with fewer voids, which improves capacitance of the MIM structure. For example, a BARC may be deposited and etched back in order to allow for removal of the barrier layer from the upper portion of the recess but not from a bottom portion of the recess. Additionally, the barrier layer may be formed using PVD to reduce carbon impurities, as compared with ALD, which improves resistance for the MIM structure.

As described in greater detail above, some implementations described herein provide a semiconductor structure. The semiconductor structure includes a metal-insulator-metal (MIM) structure in a dielectric layer. The semiconductor structure includes a first barrier layer between the MIM structure and the dielectric layer and directly contacting a first portion of sidewalls of the dielectric layer. The semiconductor structure includes a second barrier layer between the MIM structure and the dielectric layer and directly contacting a second portion of the sidewalls of the dielectric layer.

As described in greater detail above, some implementations described herein provide a method. The method includes forming a recess in a dielectric layer to expose a surface of a copper metallization layer. The method includes forming, using physical vapor deposition (PVD), a first barrier layer on sidewalls of the recess and the exposed surface of the copper metallization layer. The method includes forming a carbon-based layer in the recess, wherein a top surface of the carbon-based layer is below a top surface of the dielectric layer. The method includes etching the first barrier layer to remove a portion of the first barrier layer above the top surface of the carbon-based layer. The method includes removing the carbon-based layer to re-open the recess. The method includes forming, using PVD, a second barrier layer over the first barrier layer and on sidewalls of the recess. The method includes forming a metal-insulator-metal (MIM) structure in the recess.

As described in greater detail above, some implementations described herein provide a method. The method includes forming a recess in a dielectric layer. The method includes forming a first barrier layer on sidewalls and a bottom surface of the recess. The method includes forming a carbon-based layer in the recess. The method includes etching a portion of the carbon-based layer, such that a top surface of a remaining portion of the carbon-based layer is below a top surface of the dielectric layer. The method includes etching the first barrier layer to remove a portion of the first barrier layer above the top surface of the remaining portion of the carbon-based layer. The method includes removing the remaining portion of the carbon-based layer to re-open the recess. The method includes forming a second barrier layer over the first barrier layer and on sidewalls of the recess. The method includes forming a first metal in the recess, an insulator on the first metal, and a second metal on the insulator, wherein the first metal, the insulator, and the second metal comprise a metal-insulator-metal (MIM) structure.

As used herein, "satisfying a threshold" may, depending on the context, refer to a value being greater than the threshold, greater than or equal to the threshold, less than the threshold, less than or equal to the threshold, equal to the threshold, not equal to the threshold, or the like.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
forming a recess in a dielectric layer to expose a surface of a copper metallization layer;
forming, using physical vapor deposition (PVD), a first barrier layer on sidewalls of the recess and the exposed surface of the copper metallization layer;
forming a carbon-based layer in the recess, wherein a top surface of the carbon-based layer is below a top surface of the dielectric layer;
etching the first barrier layer to remove a portion of the first barrier layer above the top surface of the carbon-based layer;
removing the carbon-based layer to re-open the recess;
forming, using PVD, a second barrier layer over the first barrier layer and on sidewalls of the recess; and
forming a metal-insulator-metal (MIM) structure in the recess,
wherein the MIM structure has a width, along a top surface of the dielectric layer, that is larger than a width along a bottom surface of the MIM structure, and
wherein the MIM structure has a width, at a point between a top surface of the dielectric layer and a bottom surface of the MIM structure, that is larger than the width along the bottom surface of the MIM structure and larger than the width along the top surface of the dielectric layer.

2. The method of claim 1,
wherein a ratio of a width of the recess to a height of the recess is in a range from approximately 0.05 to approximately 0.12.

3. The method of claim 1,
wherein removing the carbon-based layer comprises:
performing a gamma ashing using nitrogen, hydrogen, or a combination thereof.

4. The method of claim 1,
wherein etching the first barrier layer comprises:
performing a dry etching using a chlorine-based chemical.

5. The method of claim 1, further comprising:
performing a plasma treatment on the first barrier layer before forming the second barrier layer.

6. The method of claim 1,
wherein the first barrier layer comprises tantalum nitride, titanium nitride, molybdenum nitride, or aluminum nitride, or
wherein the second barrier layer comprises tantalum, ruthenium, cobalt, or a ruthenium-cobalt alloy.

7. A method, comprising:
forming a recess in a dielectric layer;
forming a first barrier layer on sidewalls and a bottom surface of the recess;
forming a carbon-based layer in the recess;
etching a portion of the carbon-based layer, such that a top surface of a remaining portion of the carbon-based layer is below a top surface of the dielectric layer;
etching the first barrier layer to remove a portion of the first barrier layer above the top surface of the remaining portion of the carbon-based layer;
removing the remaining portion of the carbon-based layer to re-open the recess;
forming a second barrier layer over the first barrier layer and on sidewalls of the recess; and
forming a first metal in the recess, an insulator on the first metal, and a second metal on the insulator, wherein the first metal, the insulator, and the second metal comprise a metal- insulator-metal (MIM) structure,
wherein the MIM structure has a width, along a top surface of the dielectric layer, that is larger than a width along a bottom surface of the MIM structure, and
wherein the MIM structure has a width, at a point between a top surface of the dielectric layer and a bottom surface of the MIM structure, that is larger than the width along the bottom surface of the MIM structure and larger than the width along the top surface of the dielectric layer.

8. The method of claim 7,
wherein a width of the recess is in a range from approximately 0.11 micrometers (μm) to approximately 0.17 μm.

9. The method of claim 7,
wherein a height of the recess is in a range from approximately 1.5 micrometers (μm) to approximately 2.0 μm.

10. The method of claim 7,
wherein etching the portion of the carbon-based layer comprises:
performing a gamma ashing using nitrogen, hydrogen, or a combination thereof.

11. The method of claim 7,
wherein forming the first metal, the insulator, and the second metal comprises:
forming the first metal using physical vapor deposition (PVD);
forming the insulator using PVD, wherein the insulator comprises a plurality of oxide materials; and
forming the second metal using PVD.

12. The method of claim 7,
wherein the first metal and the second metal comprise titanium nitride, and the insulator comprises zirconium oxide or aluminum oxide.

13. The method of claim 7, further comprising:
performing a plasma treatment on the first barrier layer before forming the second barrier layer.

14. A method, comprising:
forming a metal-insulator-metal (MIM) structure in a dielectric layer;
forming a first barrier layer between the MIM structure and the dielectric layer and directly contacting a first portion of sidewalls of the dielectric layer; and
forming a second barrier layer between the MIM structure and the dielectric layer and directly contacting a second portion of the sidewalls of the dielectric layer,
wherein the MIM structure has a width, along a top surface of the dielectric layer, that is larger than a width along a bottom surface of the MIM structure, and
wherein the MIM structure has a width, at a point between a top surface of the dielectric layer and a bottom surface of the MIM structure, that is larger than the width along the bottom surface of the MIM structure and larger than the width along the top surface of the dielectric layer.

15. The method of claim 14,
wherein the first barrier layer has approximately 0% carbon.

16. The method of claim 14,
wherein the first barrier layer and the second barrier layer have a total thickness, at a bottom surface of the MIM structure, in a range from approximately 60 Ångströms (Å) to approximately 800 Å.

17. The method of claim 14,
wherein the first barrier layer comprises tantalum nitride, titanium nitride, molybdenum nitride, or aluminum nitride.

18. The method of claim 14,
wherein the second barrier layer comprises tantalum, ruthenium, cobalt, or a ruthenium-cobalt alloy.

19. The method of claim 14,
wherein the first barrier layer is further between the MIM structure and a copper metallization layer.

20. The method of claim 14, further comprising:
performing a plasma treatment on the first barrier layer before forming the second barrier layer.

* * * * *